United States Patent
Dammann et al.

(10) Patent No.: US 7,041,749 B2
(45) Date of Patent: May 9, 2006

(54) DUAL CURE REACTION PRODUCTS OF SELF-PHOTOINITIATING MULTIFUNCTION ACRYLATES WITH CYCLOALIPHATIC EPOXY COMPOUNDS

(75) Inventors: Laurence G. Dammann, Powell, OH (US); Robert B. Fechter, Worthington, OH (US); Sridevi Narayan-Sarathy, Hilliard, OH (US)

(73) Assignee: Ashland Licensing and Intellectual Property LLC, Ashland, KY (US)

( * ) Notice: Subject to any disclaimer, the term of this patent is extended or adjusted under 35 U.S.C. 154(b) by 124 days.

(21) Appl. No.: 10/712,044

(22) Filed: Nov. 14, 2003

(65) Prior Publication Data

US 2004/0115437 A1  Jun. 17, 2004

(51) Int. Cl.
*C08L 63/00* (2006.01)
*C08L 63/10* (2006.01)

(52) U.S. Cl. ............. 525/532; 525/438; 525/454; 525/524

(58) Field of Classification Search ............ 525/532
See application file for complete search history.

(56) References Cited

U.S. PATENT DOCUMENTS

| | | | | |
|---|---|---|---|---|
| 5,218,018 A | * | 6/1993 | Tominaga et al. | 523/412 |
| 5,565,525 A | * | 10/1996 | Morimoto et al. | 525/259 |
| 5,667,901 A | * | 9/1997 | Heidt et al. | 428/482 |
| 5,945,489 A | * | 8/1999 | Moy et al. | 525/471 |
| 6,025,410 A | * | 2/2000 | Moy et al. | 522/182 |
| 6,576,297 B1 | * | 6/2003 | Cameron et al. | 427/372.2 |
| 6,706,414 B1 | * | 3/2004 | Dammann et al. | 428/524 |

FOREIGN PATENT DOCUMENTS

| | | | |
|---|---|---|---|
| EP | 1245655 A2 | * | 10/2002 |
| JP | 11092546 A | * | 4/1999 |

* cited by examiner

*Primary Examiner*—Robert Sellers
(74) *Attorney, Agent, or Firm*—Connolly Bove Lodge & Hutz, LLP (57) ABSTRACT

Photopolymerizable liquid oligomeric compositions are disclosed. The oligomeric compositions are formed from cycloaliphatic epoxides and Michael addition polyacrylate resins, synthesized from multifunctional acrylates and β-dicarbonyl Michael donors, specifically β-keto esters, β-diketones, β-ketoamides or β-ketoanilides or combinations thereof. The oligomeric compositions are provided along with uses thereof and methods of fabricating.

28 Claims, 2 Drawing Sheets

Figure 1.

PEG 600 diacetoacetate (n = ~ 3-4)

TMPTA

Strong base catalyst

Figure 2.

DUAL CURE REACTION PRODUCTS OF SELF-PHOTOINITIATING MULTIFUNCTION ACRYLATES WITH CYCLOALIPHATIC EPOXY COMPOUNDS

This Nonprovisional application claims priority under 35 U.S.C. § 119(a) on Patent Application No(s). 91136357 filed in TAIWAN on Dec. 17, 2002, the entire contents of which are hereby incorporated by reference.

FIELD OF THE INVENTION

The present invention relates generally to photopolymerizable resins. The invention relates specifically to oligomeric compositions comprising cycloaliphatic epoxide compounds and multifunctional acrylate oligomers synthesized from multifunctional acrylates and β-ketoesters, β-diketones, β-ketoamides, or β-ketoanilides.

BACKGROUND

The information provided below is not admitted to be prior art to the present invention, but is provided solely to assist the understanding of the reader.

Acrylate, methacrylate and other unsaturated monomers are widely used in coatings, adhesives, sealants, and elastomers, and may be crosslinked by ultraviolet light in the presence of photoinitiators or peroxide-initiated free radical cure. These photoinitiators and/or peroxides are typically low molecular weight multifunctional compounds that may be volatile or readily absorbed through skin and can cause adverse health effects. Functionalized oligomeric photoinitiators may overcome some of these drawbacks; generally, polymeric photoinitiators are nonvolatile compounds, not readily absorbed through skin. However, multistep syntheses may be required, low functionality may be detrimental to reactivity and final properties, and catalyst or initiator may still be required to effect crosslinking.

The Michael addition of acetoacetate donor compounds to multiacrylate receptor compounds to make crosslinked polymers has been described in the literature. For example, Mozner and Rheinberger reported the Michael addition of acetoacetates to triacrylates and tetracrylates. (16 Macromolecular Rapid Communications 135 (1995)). The products formed were crosslinked gels. In one such reaction, depicted in FIG. 1, Mozner added one mole of trimethylol propane triacrylate (TMPTA) having 3 functional groups to one mole of polyethylene glycol (600 molecular weight) diacetoacetate (PEG600-DAA) having two functional groups. (Each acetoacetate "functional group" reacts twice, thus each mole of diacetoacetate has four reactive equivalents.) The resulting network is considered "gelled", or cured, despite the presence of unreacted acrylic functional groups. While further reaction can be promoted, this network cannot be made liquid either with heat or solvent because it is effectively crosslinked.

Figure 1:
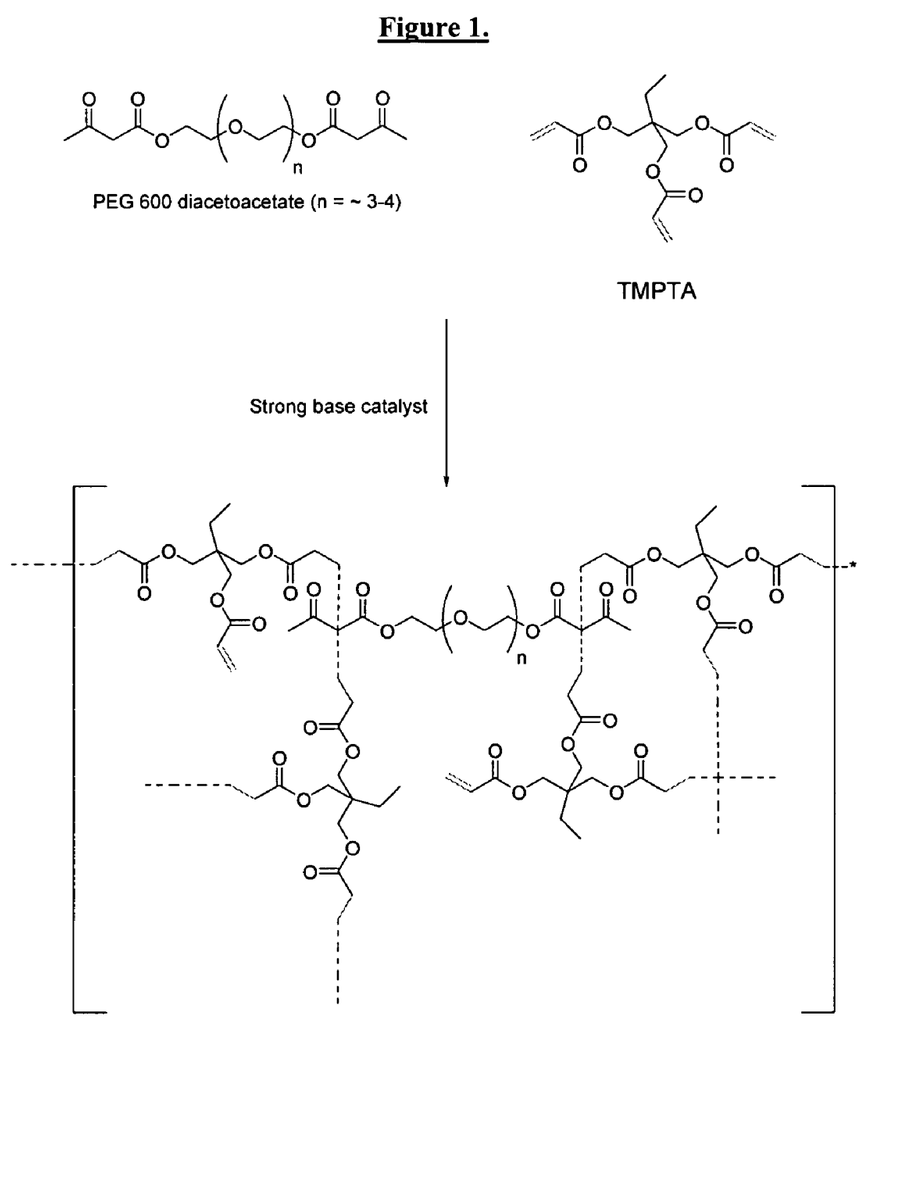
FIG. 1 is a schematic of the synthesis of a crosslinked Michael polyacrylate gel.

The reaction can be characterized by various ratios to describe the reactants: a mole ratio of TMPTA:PEG 600 DAA=1:1, a functional group ratio of the number of acrylate to acetoacetate functional groups=3:2, and a ratio of reactive equivalents=3:4.

U.S. Pat. Nos. 5,945,489 and 6,025,410, to Moy et al., assigned to Ashland, Inc., the assignee of the present invention, disclose that certain organic soluble liquid uncrosslinked oligomers, made by one step Michael addition of β-dicarbonyl donor compounds (e.g., acetoacetates) to multiacrylates, can be further crosslinked using ultraviolet light without requiring costly photoinitiators. The disclosed oligomers may be described as self-photoinitiating acrylate resins. Moreover, when precise proportions of multiacrylate acceptor compounds to β-dicarbonyl donor compounds are combined in the presence of a basic catalyst, liquid oligomeric compositions result. If proportions below the ranges disclosed in the above-cited patent documents are used, crosslinked gels or solid products are made. In addition, the disclosed liquid oligomer compositions can readily be applied to various substrates using conventional coating techniques such as roll or spray prior to ultraviolet light cure.

The term monomer is herein defined as a molecule or compound, usually containing carbon and of relatively low molecular weight and simple structure, which is capable of conversion to polymers, synthetic resins, or elastomers by combination with other similar and/or dissimilar molecules or compounds.

The term oligomer is herein defined as a polymer molecule consisting of only a few similar and/or dissimilar monomer units.

The term resin is herein defined as an oligomer, which is capable of conversion to high molecular weight polymers by combination with other similar and/or dissimilar molecules or compounds.

The term thermoset is herein defined to be a high molecular weight polymer product of resins that solidifies or sets irreversibly when heated. This property is associated with crosslinking reactions of the molecular constituents induced by heat, radiation, and/or chemical catalysis.

Co-pending application Ser. No. 10/628,373, assigned to the assignee of the present invention, the entire disclosure of which is expressly incorporated by reference and for all purposes, discloses a dual-cure thiolene system comprising a self-initiated acrylate resin crosslinked with a polyfunctional thiol.

The utility of acrylate-based resin systems is limited by their relatively poor adhesion to metal substrates. Adhesion to metals can be enhanced by using cationic-cured aliphatic epoxy compounds.

SUMMARY OF INVENTION

We now disclose that the addition of suitable cycloaliphatic epoxides, in the presence of a suitable cationic initiator, to the above-disclosed polyacrylate resins leads to coatings having a much better surface cure with enhanced adhesion, hardness, and mar resistance.

The present invention provides for dual-cure polymerizing resin compositions. Coatings, adhesives, sealants, and inks may be produced using the resins of the present invention that cure by two different mechanisms. A first mechanism is a UV-initiated free-radical polymerization of Michael addition resins bearing pendant acrylate functionalities. A second mechanism, the so-called cationic cure, provides a UV-initiated acid polymerization of epoxy resins catalyzed by a photo-generated strong acid. In the cationic cure process, a cationic photoinitiator is dissociated by UV light to produce a strong Lewis or Brönsted acid. Cationic photoinitiators are preferably perfluorometallate onium salts.

The present invention provides liquid oligomeric compositions comprising: a difunctional cycloaliphatic epoxide; and an organic soluble, ungelled, uncrosslinked, Michael addition resin, wherein the Michael resin is formed from, but not limited to, a multifunctional acrylate Michael acceptor and a β-dicarbonyl Michael donor, specifically β-keto esters, β-diketones, β-ketoamides, cyanoacetates, or β-ketoanilides or combinations thereof.

The present invention provides liquid oligomeric compositions that are shelf stable for more than one month and have residual pendant unsaturated acrylate groups (in contrast to unsaturation in the oligomer "backbone" such as is obtained in the making of unsaturated polyester resins) and which photopolymerize exceptionally fast upon exposure to UV radiation.

The present invention provides liquid oligomeric compositions optionally further comprising at least one additive selected from the group consisting of pigments, gloss modifiers, flow and leveling agents and other additive as appropriate to formulate coatings, paints, laminates, sealants, adhesives, and inks. A good general reference disclosing such additives is *The Encyclopedia of Polymer Science and Engineering*, $2^{nd}$ Edition, Wiley-Interscience Publications (1985).

The present invention provides a method of making liquid oligomeric compositions having residual pendant unsaturated acrylate groups, which comprises: providing a multifunctional acrylate Michael acceptor and a β-dicarbonyl Michael donor; reacting the donor and the acceptor using a base catalyst to form a Michael adduct; adding an acidifying agent to neutralize any residual basic species and admixing at least one cycloaliphatic epoxide.

An aspect of the present invention provides a liquid oligomeric composition further comprising at least one modifying epoxide. Modifying epoxides are selected to improve the film properties of the cured coating, such as adhesion to metals, and/or to reduce the viscosity of the coating for application purposes. The Michael polyacrylate resin/epoxide dual cure system can develop "green strength" or "blocking resistance" with a miniscule UV pulse or with only a tiny amount of amine or peroxide catalyst. Once having attained a first stage or initial degree of cure, the coating can then be manipulated by forming, printing, or laminating operations prior to affecting full cure. Thus, the capability of dual cure allows for manipulation of the substrate in ways that conventional systems, including conventional UV-cured coatings, cannot emulate.

The present invention provides a method of using a liquid oligomeric composition comprising: a cycloaliphatic epoxide, and an organic soluble, ungelled, uncrosslinked, Michael addition polyacrylate reaction product; applying the oligomeric composition to a surface; and curing the composition in the presence of a cationic photoinitiator and actinic light.

An aspect of the present invention provides thermosets formed from the inventive oligomeric compositions.

The present invention provides a method of using a liquid oligomeric composition wherein the composition further comprises at least one additive selected from the group consisting of pigments, gloss modifiers, flow and leveling agents and other additives as appropriate to formulate coatings, paints, laminates, sealants, adhesives, and inks.

An aspect of the present invention provides oligomeric compositions that may be further crosslinked to make coatings (e.g., paints, varnishes), inks, laminates, sealants, adhesives, elastomers, and composite matrices.

The present invention provides a polymerized product comprising: a cycloaliphatic epoxide and an organic soluble, ungelled, uncrosslinked, Michael addition polyacrylate reaction product, further crosslinked in the presence of a cationic photoinitiator.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

An aspect of the present invention provides a liquid oligomeric composition comprising a controlled ratio mixture of a cycloaliphatic epoxide, a cationic photoinitiator, and an organic soluble, ungelled, uncrosslinked, Michael addition polyacrylate reaction product. The Michael addition polyacrylate oligomer is formed from a multifunctional acrylate Michael acceptor and a β-dicarbonyl Michael donor. The β-dicarbonyl Michael donor is suitably chosen from among β-keto esters, β-diketones, β-ketoamides, and β-ketoanilides. The multifunctional acrylate Michael acceptor is suitably chosen from among diacrylates, triacrylates, and tetraacrylates. The range of β-dicarbonyl donors and multifunctional acrylate acceptors affords the composition designer the opportunity to exercise a great range of selectivity in the properties of the final product. The properties of the final crosslinked product can be varied, in a controlled manner, by using different oligomers, different epoxides, and/or by varying the ratio of the Michael oligomer to epoxide.

Preferred diacrylates include, but are not limited to: ethylene glycol diacrylate, propylene glycol diacrylate, diethylene glycol diacrylate, dipropylene glycol diacrylate, triethylene glycol diacrylate, tripropylene glycol diacrylate, tertraethylene glycol diacrylate, tetrapropylene glycol diacrylate, polyethylene glycol diacrylate, polypropylene glycol diacrylate, ethoxylated bisphenol A diacrylate, bisphenol A diglycidyl ether diacrylate, resorcinol diglycidyl ether diacrylate, 1,3-propanediol diacrylate, 1,4-butanediol diacrylate, 1,5-pentanediol diacrylate, 1,6-hexanediol diacrylate, neopentyl glycol diacrylate, cyclohexane dimethanol diacrylate, ethoxylated neopentyl glycol diacrylate, propoxylated neopentyl glycol diacrylate, ethoxylated cyclohexanedimethanol diacrylate, propoxylated cyclohexanedimethanol diacrylate, epoxy diacrylate, aryl urethane diacrylate, aliphatic urethane diacrylate, polyester diacrylate, and mixtures thereof.

Preferred triacrylates include, but are not limited to: trimethylol propane triacrylate, glycerol triacrylate, ethoxylated trimethylolpropane triacrylate, propoxylated trimethylolpropane triacrylate, tris (2-hydroxyethyl) isocyanurate triacrylate, ethoxylated glycerol triacrylate, propoxylated glycerol triacrylate, pentaerythritol triacrylate, aryl urethane triacrylates, aliphatic urethane triacrylates, melamine triacrylates, epoxy novolac triacrylates, aliphatic epoxy triacrylate, polyester triacrylate, and mixtures thereof.

Preferred tetraacrylates include, but are not limited to: di-trimethylolpropane tetraacrylate, pentaerythritol tetraacrylate, ethoxylated pentaerythritol tetraacrylate, propoxylated pentaerythritol tetraacrylate, dipentaerythritol tetraacrylate, ethoxylated dipentaerythritol tetraacrylate, propoxylated dipentaerythritol tetraacrylate, aryl urethane tetraacrylates, aliphatic urethane tetraacrylates, polyester tetraacrylates, melamine tetraacrylates, epoxy novolac tetraacrylates, and mixtures thereof.

In a preferred embodiment, the β-dicarbonyl Michael donor is a β-diketone (e.g., 2, 4-pentanedione). Suitably, the present invention may also be practiced with a β-ketoester (e.g., ethyl acetoacetate), a β-ketoanilide (e.g., acetoacetanilide) or a β-ketoamide (e.g., acetoacetamide) or a mixture of Michael donors according to the desired resin quality and end use. In preferred embodiments of the present invention, the β-dicarbonyl has functionality (N) wherein N=2. β-dicarbonyl donors of higher functionality (i.e., N=4,6 . . .) are suitable, but more careful control of reaction stoichiometry must be exercised to avoid unwanted system gellation.

Suitable β-dicarbonyl donor compounds having functionality=2 include, but are not limited to: ethyl acetoacetate, methyl acetoacetate, 2-ethylhexyl acetoacetate, lauryl acetoacetate, t-butyl acetoacetate, acetoacetanilide, N-alkyl acetoacetanilide, acetoacetamide, 2-acetoacetoxyethyl acrylate, 2-acetoacetoxyethyl methacrylate, allyl acetoacetate, benzyl acetoacetate, 2,4-pentanedione, isobutyl acetoacetate, and 2-methoxyethyl acetoacetate.

Suitable β-dicarbonyl donor compounds having functionality=4 include, but are not limited to: 1,4-butanediol diacetoacetate, 1,6-hexanediol diacetoacetate, neopentyl glycol diacetoacetate, cyclohexane dimethanol diacetoacetate, and ethoxylated bisphenol A diacetoacetate.

Suitable β-dicarbonyl donor compounds having functionality=6 include, but are not limited to: trimethylol propane triacetoacetate, glycerin triacetoacetate, and polycaprolactone triacetoacetates.

A preferred, but not limiting, β-dicarbonyl donor compound having functionality=8, is pentaerythritol tetraacetoacetate.

The Michael addition reaction is catalyzed by a strong base. A preferred base is diazabicycloundecene (DBU), which is sufficiently strong and is readily soluble in the monomer mixtures. Other cyclic amidines, for example diazabicyclo-nonene (DBN) and guanidines are also suitable for catalyzing this polymerization. Group I alkoxide bases such as potassium tert-butoxide, provided they have sufficient solubility in the reaction medium, are typically adequate to promote the desired reaction. Quaternary hydroxides and alkoxides, such as tetrabutyl ammonium hydroxide or benzyltrimethyl ammonium methoxide, comprise another class of preferred base catalysts to promote the Michael addition reaction. Finally, strong, organophilic alkoxide bases can be generated in situ from the reaction between a halide anion (e.g., quaternary halide) and an epoxide moiety. Such in situ catalysts are disclosed in pending application Ser. No. 10/255,541 assigned to Ashland, Inc., the assignee of the present application. The entire contents of application Ser. No. 10/255,541 is specifically incorporated by reference in its entirety and for all purposes.

Michael addition of a methacrylate-functional β-dicarbonyl compound, e.g., 2-acetoacetoxyethyl methacrylate (AAEM), to a diacrylate monomer yields liquid polyacrylates with reactive pendant methacrylate groups, which can be crosslinked in a subsequent curing reaction. As the acrylate and acetoacetate are mutually reactive and the methacrylate is essentially inert under the conditions of the desired Michael addition reaction, a highly functionalized (one methacrylate per repeat unit), liquid uncrosslinked oligomer can be obtained in a one-step, ambient temperature, solventless reaction.

The present invention confers an advantage in not requiring a solvent. However, the high selectivity of the Michael reaction permits the use of monomers such as styrene and methyl methacrylate as inert solvents to give low-viscosity systems that are easily incorporated into a variety of laminating resins. Suitable, non-limiting, non-reactive solvents include styrene, t-butyl styrene, α-methyl styrene, vinyl toluene, vinyl acetate, allyl acetate, allyl methacrylate, diallyl phthalate, $C_1$–$C_{18}$-methacrylate esters, dimethacrylates, and trimethacrylates.

The present invention provides a resin having residual pendant unsaturated acrylate groups. Residual pendant unsaturation means that polymerizable acrylic groups are retained by means of careful control of the reactant stoichiometry. That is, there are more acrylic groups than reactive sites on the Michael donor. The nature of that addition reaction leaves pendant (versus present as part of the "backbone" of the structure where it is attached on two sides) acrylic groups away from the site of the Michael addition. The pendant acrylic groups are available for free radical polymerization, further Michael addition crosslinking or "pseudo Michael addition" reactions, e.g., with amines. Pseudo-Michael reaction by a thiol-ene addition with mercaptans upon UV exposure is disclosed in co-pending application Attorney Docket 20435/0141, the entire disclosure of which is hereby specifically incorporated by reference and for all purposes. The pendant acrylate groups of the Michael polyacrylate resin are also available for crosslinking by a free radical mechanism in the presence of a strong-acid-generating cationic photoinitiator since free radicals are also formed by the photolysis process.

In the following Examples all parts are by weight unless otherwise indicated.

Figure 2:
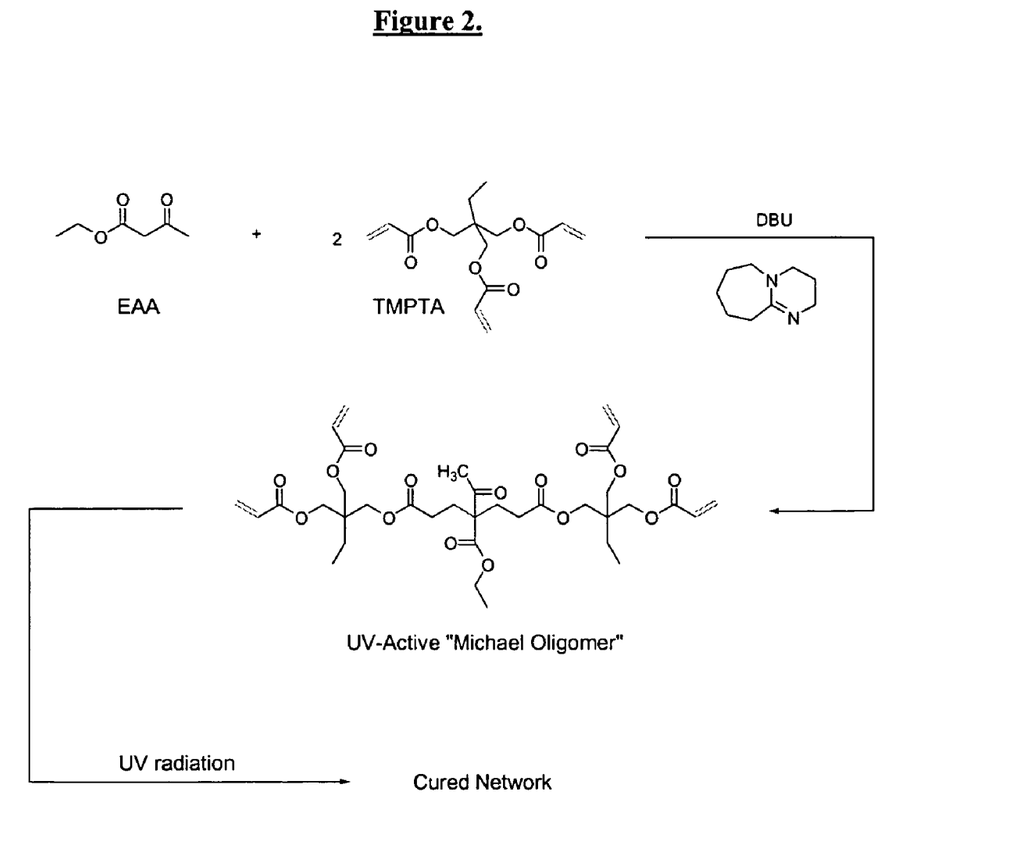
FIG. 2 is a schematic of the synthesis of a UV-curable oligomer from the Michael Addition reaction of trimethylolpropane triacrylate (TMPTA) and ethyl acetoacetate (EAA).

An example of Michael polyacrylate resin (also termed Michael oligomer, Michael adduct, or Michael addition product) synthesis is given in FIG. 2. Trimethylolpropane triacrylate (TMPTA) 59.2 g and diazabicycloundecene (DBU) 0.4 g were weighed into a 500 ml 3-neck round bottom flask equipped with a mechanical stirrer and addition funnel. Ethyl acetoacetate (EAA) 13.0 g was weighed into the addition funnel. The TMPTA and DBU were mixed for 5 minutes prior to addition of the EAA. EAA was then added dropwise to the stirred TMPTA/DBU mixture over a 15-minute period. The solution warmed to 54 degrees Celsius after addition of EAA was complete. After the exotherm subsided in 100 minutes a viscous yellow liquid was obtained which did not gel upon standing.

The same general procedure can be employed for a variety of combinations of acrylate and β-dicarbonyl Michael donors, provided the equivalent ratio of acrylate: Michael donor is sufficient to yield liquid, uncrosslinked products. For particularly exothermic or large scale reactions, controlled, gradual addition of Michael donor and/or cooling of the reaction may be required to prevent premature, thermally initiated crosslinking of acrylate functional groups.

An aspect of the present invention provides for a dual-cure mechanism. Cycloaliphatic epoxide compounds are added with a suitable cationic photoinitiator to a Michael acrylate resin. Cationic photoinitiators are onium compounds that photolyze when excited by ultraviolet (UV) light. The photo-dissociation of the various onium species yields Lewis or Bronsted acids. (See Koleske, J. V., *Radiation Curing of Coatings*, ASTM Manual 45, (2002)). As part of the photolysis process, free radicals are formed which can catalyze the polymerization of the ethylenic unsaturation present in the resin. Polymerization of epoxides and ethylenically unsaturated compounds is catalyzed by the strong acids dissociated upon photolysis of the onium photoinitiator.

The cationic photoinitiators of the present invention are onium salts that, upon UV-irradiation, decompose to form strong acids. More specifically, the photoinitiators comprise aryl sulfonium metallic salts, aryl iodonium metallic salts, and aryl phosphonium metallic salts. These and other cationic photoinitiators are included in Chapter III on "Photoinitiators for Cationic Polymerisation," by J. V. Crivello and K. Dietliker, in Wiley/SITA Series in Surface Coatings Technology, Vol. III, G. Bradley, Ed., John Wiley and Sons Ltd., Chichester, England, 1998, p. 329. The recited onium salts are understood to be non-limiting examples of suitable and preferred cationic photoinitiators. Persons of skill in the arts will be familiar with, or will be able to determine with minimal experimentation, other suitable cationic photoinitiators.

An example of an aryl sulfonium cation is the triarylsulfonium (e.g., triphenylsulfonium) cation. It is understood that a triaryl sulfonium cation exists as a complex mixture of aryl sulfonium salts. The term "triarylsulfonium," is used herein to mean the complex mixture of aryl sulfonium species and/or any one of such species.

An example of an aryl iodonium cation is the diaryliodonium (e.g., diphenyliodonium) cation. It is understood that a diaryliodonium cation exists as a complex mixture of diaryliodonium salts. The term "diaryliodonium," is used herein to mean the complex mixture of aryl iodonium species and/or any one of such species.

An example of an aryl phosphonium cation is the tetraarylphosphonium (e.g., tetraphenylphosphonium) cation. It is understood that a tetraarylphosphonium cation exists as a complex mixture of tetraarylphosphonium salts. The term "tetraarylphosphonium," is used herein to mean the complex mixture of aryl phosphonium species and/or any one of such species.

An undissociated onium cationic photoinitiator consists of an onium cation, preferably a polyarylonium cation complexed with a pseudo-metallic anion ($X^-$). Preferred pseudo-metallic anions are perfluorometallate anions. Suitable pseudo-metallic anions ($X^-$) are known to the art. Non-limiting examples of suitable and preferred pseudo-metallic anions include: $BF_4^-$, $PF_6^-$, $SbF_6^-$, and $B(C_6F_5)_4^-$.

The cationic photoinitiator of the present invention may also comprise an organometallic compound such as an iron arene salt, a zirconocene salt, or a manganese decacarbonyl salt. Suitable organometallic compounds are disclosed in Koleske, J V, *Radiation Curing of Coatings*, ASTM Manual 45 (2002).

Michael additions are catalyzed by a strong base such as diazabicycloundecene (DBU). Following the Michael reaction, it is preferred to react, and neutralize, the base by addition of an acidifying agent. Suitable acidifying agents include, but are not limited to, phosphoric acids, carboxylic acids, acid half esters, and inorganic acid esters (e.g., hydroxyethyl methacrylate phosphate or hydroxyethyl acrylate phosphate). Preferably, the acidifying agent is added in an amount at least stoichiometric to the base. However, the acidifying agent may be added in super-stoichiometric amounts, but this may cause shelf stability problems.

Prior to effecting cure, the reactants can be mixed at any time to form a stable, homogeneous mixture provided there are no basic species present (e.g., amines, alkoxides, phenoxides, etc.) that can catalyze crosslinking. Shelf stability, defined qualitatively as the absence of premature gelation (i.e., cure) and minimal increase in resin viscosity, can be achieved provided the system has been adequately "acidified" and the mixture kept free from exposure to actinic light. There is no established "benchmark" in this regard. The criterion of acceptability is defined by the end user.

Epoxides suitable for purposes of the present invention may be chosen by a person skilled in the art from a wide range of commercially-available epoxides. The choice of epoxide is governed by the properties desired to be possessed by the final cured product. To effect crosslinking, the epoxide must be at least bi-functional. A preferred bi-functional epoxide is bis-(3,4-epoxycyclohexyl)adipate. A more preferred bi-functional epoxide is 3,4-epoxycyclohexylmethyl-3,4-epoxycyclohexane carboxylate. Compounds with more than two epoxide functionalities are also suitable for purposes of the present invention.

Epoxides suitable for the present invention have a Brookfield viscosity less than about 1,000 cP at 25° C. Suitable epoxides confer strong adhesion to metals upon cure. Persons of skill in the art may readily determine appropriate values of adhesion by among other tests, the ASTM D3359 method as known to the art. Suitable epoxides are clear, single-phase liquids under standard temperatures and pressures. Moreover, suitable epoxides are stable as defined by minimal tendency to separate from, or react with, admixed Michael oligomers.

The properties of the final compositions may be suitably modified by inclusion of "modifying epoxides." Epoxides suitable as modifiers include limonene monoxide, diglycidyl ether of bisphenol A, and epoxy phenol novolacs. The last two recited epoxides are not considered as cycloaliphatic epoxides. However, they are suitable for the purposes of the present invention.

Ultraviolet light photopolymerization was demonstrated by applying a portion of the inventive composition to a surface. The composition was spread over the surface to a thickness of up to about 3 mils. The resins were applied aluminum or stainless steel substrates by the "draw down" technique. Specimens were cured with a Fusion Systems Corp. UV curing unit using a 600-watt H-bulb and a belt-speed of 40 feet/minute.

Coating performance properties are measured by a variety of different test methods familiar to persons of skill in the art. Hardness and chemical resistance were assessed on aluminum panels, adhesion was assessed on steel panels, and mar resistance measurements were performed on white painted aluminum panels.

Hardness. Film hardness is the ability of a coating to resist cutting, sheering, or penetration by a hard object. A method of measuring the coating's hardness is to scratch the film with pencil leads of known hardness. The result is reported as the hardest lead that will not scratch or cut through the film to the substrate. While this test is quite subjective, it does provide a quick and rather reliable method to determine film hardness. As measured by the pencil method: soft <6B-5B-4B-3B-2B-B-HB-F-H-2H-3H-4H-5H-6H> hard. The method follows the procedure of ASTM D3363.

Solvent Resistance. Solvent resistance is the ability of a coating to resist solvent attack or film deformity. Rubbing the coating with a cloth saturated with an appropriate solvent is one way to assess when a specific level of solvent resistance is achieved. All rubbing tests were conducted using methyl ethyl ketone (MEK) and employed a double rub technique, one complete forward and backward motion over the coated surface. To normalize test strokes, cheesecloth was fixed to the round end of a 16-oz. ball peen hammer. The double rub technique utilizes the weight of the hammer as the operator holds the hammer at the base of the handle. This test was performed until the double rubbing action cut into the film or a noticeable film disorder was evident. The method is modified from the procedure of ASTM D4752.

Gloss. Measured using a glossmeter. The method follows the procedure of ASTM D523.

Mar resistance. Measured using an Atlas Crockmeter® and 0000 steel wool. The test method used is from ASTM D6279, using a black pigmented panel as a substrate and measuring 20° gloss before and after abrasion; or is modified from ASTM 6279 by using a white pigmented substrate panel and measuring 60° gloss. Mar resistance is reported in terms of % gloss retention, defined as (gloss of abraded coating/gloss of unabraded coating) X 100.

Adhesion was tested using iron phosphated steel Q-panels® as the test coating substrate. (Q-panel® is a trademark of Q-Panel Lab Products, Cleveland, Ohio.). Adhesion testing was performed by the crosshatch method on rigid substrates using a modified method of ASTM D3359 by Test Tape Method B, using a Gardco Blade PA-2054 (11-tooth, 1.5 mm cutter) Test Tape used was Permacel #99. The ASTM test reports values from 0B to 5B, with 0B being a total failure, and 5B characterizing excellent adhesion.

EXAMPLE 1

Novel Michael addition polyacrylate resins based on Michael donors ethyl acetoacetate and 2,4-pentanedione were synthesized according to the method described in U.S. Pat. Nos. 5,945,489 and 6,025,410. The Michael polyacrylate resins were mixed with various cycloaliphatic epoxides at different levels. The resin/epoxide compositions were then applied to phosphated steel substrates and cured" at a UV dosage of 1500 mJ/cm$^2$. All tests were conducted on the cured resin coatings 24 hours after UV irradiation to ensure that the subsequent so-called "dark cure" of the epoxy component was complete. Results are collectively reported in Tables I, II, and III:

TABLE I

|  | 1 | 2 | 3 | 4 | 5 |
| --- | --- | --- | --- | --- | --- |
| Michael addition polyacrylate resin A | 100.00 | 50.00 | 0.00 | 50.00 | 0.00 |
| UVR 6105 | 0.00 | 50.00 | 100.00 | 0.00 | 0.00 |
| UVR 6128 | 0.00 | 0.00 | 0.00 | 50.00 | 100.00 |
| Sartomer CD1010 | 0.00 | 2.50 | 5.00 | 2.50 | 5.00 |
| 10% 3M Fluorad FC 4430 in MEK | 1.60 | 1.60 | 1.60 | 1.60 | 1.60 |
| Solvent Resistance, MEK Double Rubs | >200 | >200 | >200 | >200 | 40 failed |
| Adhesion | 0B | 4B | 5B | 5B | 5B |
| Pencil Hardness | B | 4H | 5H | 2H | 2H |
| Gloss at 60°/20° | 88.4/81.7 | 91.8/84.1 | 93.5/84.0 | 91.1/86.3 | 92.7/84.2 |
| Mar Resistance, % at 20° | 62.4 | 53.6 | 59.1 | 51.4 | 47.2 |

In Table I, Michael addition polyacrylate resin A was a 75/25 molar blend of hexanediol diacrylate (HDDA) and trimethylolpropane triacrylate (TMPTA) reacted with ethyl acetoacetate in a 2.2:1 molar ratio of total acceptor to donor, and neutralized with Ebecryl 168 (hydroxyethyl methacrylate phosphate). The epoxy compounds were CYRACURE® UVR-6105 and CYRACURE® UVR-6128 (Union Carbide Corp), respectively, 3,4-epoxycyclohexylmethyl-3,4-epoxycyclohexanecarboxylate and bis-(3,4-epoxycyclohexylmethyl) adipate, respectively. The photoinitiator used was CD-1010® (Sartomer), a mixture of triarylsulfonium hexafluoroantimonate salts 50% in propylene carbonate. The leveling agent used was Fluorad® FC 4430 (3M Corp.).

TABLE II

|  | 6 | 7 | 8 | 9 | 10 |
|---|---|---|---|---|---|
| Michael addition polyacrylate resin B | 100.00 | 50.00 | 0.00 | 50.00 | 0.00 |
| UVR 6105 | 0.00 | 50.00 | 100.00 | 0.00 | 0.00 |
| UVR 6128 | 0.00 | 0.00 | 0.00 | 50.00 | 100.00 |
| Sartomer CD1010 | 0.00 | 2.50 | 5.00 | 2.50 | 5.00 |
| 10% 3M Fluorad FC 4430 in MEK | 1.60 | 1.60 | 1.60 | 1.60 | 1.60 |
| Solvent Resistance, MEK Double Rubs | >200 | >200 | >200 | >200 | 40 failed |
| Adhesion | 3B | 4B | 5B | 5B | 5B |
| Pencil Hardness | HB | 2H | 5H | F | 2H |
| Gloss at 60°/20° | 89.8/83.8 | 93.4/88.5 | 93.5/84.0 | 90.8/87.4 | 92.7/84.2 |
| Mar Resistance, % at 20° | 56.4 | 52.3 | 59.1 | 43.7 | 47.2 |

Michael addition polyacrylate resin B in Table II was a 94.4/5.6 molar blend of HDDA and Laromer PE 55 F (BASF), a polyester acrylate with mol. wt. of about 1000, reacted with 2,4-pentanedione in a 2.2:1 molar ratio and neutralized with Ebecryl 168.

TABLE III

|  | 11 | 12 | 13 |
|---|---|---|---|
| Michael addition polyacrylate resin C | 100.00 | 50.00 | 0.00 |
| UVR 6128 | 0.00 | 50.00 | 100.00 |
| Sartomer CD1010 | 0.00 | 2.50 | 5.00 |
| 10% 3M Fluorad FC 4430 in MEK | 1.60 | 1.60 | 1.60 |
| Solvent Resistance, MEK Double Rubs | >200 | >200 | 40 failed |
| Adhesion | 2B | 5B | 5B |
| Pencil Hardness | 4B | HB | 2H |
| Gloss at 60°/20° | 86.6/72.3 | 91.8/85.7 | 92.7/84.2 |
| Mar Resistance, % at 20° | 31.1 | 25.3 | 47.2 |

Michael addition polyacrylate resin C in Table III was dipropylene glycol diacrylate reacted with ethyl acetoacetate in a 2.2:1 molar ratio and neutralized with Ebecryl 168.

The results in Tables I, II and III demonstrate that advantages in the performance of UV radiation cured coatings of Michael addition polyacrylate resins and of UV radiation cured coatings of epoxy compounds can be gained by combining the two together.

EXAMPLE 2

A Michael addition polyacrylate resin based on HDDA and TMPTA in the ratio 75:25 and ethyl acetoacetate was synthesized according to the method described in U.S. Pat. Nos. 5,945,489 and 6,025,410. This resin was mixed with Uvacure™ 1562 (UCB Chemicals) an acrylate-cycloaliphatic epoxide blend containing both acrylate and epoxy functionality. The mixtures were then applied to phosphated steel or aluminum substrate and cured at a UV dosage of 1500 mJ/cm². Adhesion, solvent resistance, pencil hardness, gloss, and mar resistance are as given above preceding the Examples. As explained in Example 1, all tests were conducted 24 hours after UV irradiation.

TABLE IV

|  | 1 | 2 | 3 | 4 | 5 |
|---|---|---|---|---|---|
| Resin | Ex 2 | Ex 2 | Ex 2 | Ex 2 | — |
| Epoxy | — | 1562 | 1562 | 1562 | 1562 |
| wt % Epoxy | — | 10 | 25 | 50 | 100 |
| Adhesion | 0B | 0B | 3B | 4B | 4B |
| MEK Rubs | >200 | >200 | >200 | >200 | >200 |
| Pencil hardness | 2h | 2h | 2h | 2h | b |
| Gloss at 60° | 89.5 | 90.0 | 93.2 | 94.8 | 97.7 |
| Mar Resistance at 60° | 83 | 96 | 94 | 94 | 91 |

Uses for dual cure or "hybrid cure" coating systems are similar to those for standard coatings, i.e., for substrate protection and/or decoration. However, the utility of dual cure capability allows for the development of ultimate film properties with greater latitude than conventional coating technologies. For instance, full cure, as characterized by film hardness and solvent resistance, can be accomplished in seconds with as little as 500 mJ/cm2 of UV radiation (or less) compared to a 30-minute high temperature "bake" for an alkyd or melamine-based coating. Contrasting directly with conventional UV-based coatings, the Michael polyacrylate resin/epoxide dual cure system can develop "green strength" or "blocking resistance" with a miniscule UV pulse or with only a tiny amount of amine or peroxide catalyst. Once having attained a first stage or initial degree of cure, the coating can then be manipulated by forming, printing, or laminating operations prior to affecting full cure. Once fully cured, many coatings are more difficult to bend or form and/or they don't adhere as well during forming operations. Thus, the capability of dual cure allows for manipulation of the substrate in ways that conventional systems, including conventional UV-cured coatings, cannot emulate.

Monoacrylates can be employed to moderate resin properties as needed. For instance, addition of up to 25 mol % of a monofunctional acrylate (e.g., isobornyl acrylate, IBOA) allows for "toughening" of a coating without increasing brittleness through greater crosslinking. Other monofunctional monomers, such as 2-(2-ethoxyethoxyethyl) acrylate (EOEOEA) or dodecyl acrylate, may be added to moderate film adhesion to substrates or to enhance incorporation of pigments, nano particles, waxes or silicones into a coating formulation. Suitable monoacrylates include, but are not limited to, simple $C_1$–$C_{18}$ acrylate esters, isobornyl acrylate (IBOA), tetrahydrofurfuryl acrylate (THFFA), 2-(2-ethoxyethoxy)ethyl acrylate (EOEOEA), phenoxyethyl acrylate (PEA), hydroxyalkyl acrylate, monoalkyl polyalkylene glycol acrylate, siloxane acrylate, silane acrylate, silicone acrylate, perfluoroalkyl acrylate, caprolactone acrylate, and mixtures thereof.

INCORPORATION BY REFERENCE

All publications, patents, patent application publications, and ASTM test methods cited in this specification are herein incorporated by reference, and for any and all purposes, as if each individual publication, patent, patent application publication, and ASTM test method were specifically and individually indicated to be incorporated by reference. In the case of inconsistencies the present disclosure will prevail. In particular, the entire contents of co-pending applications Ser. Nos. 10/628,373; 10/722,478; 10/834,056; 10/682,874; and 10/836,747, all pending, are hereby incorporated by reference and for all purposes.

Having thus described our invention, what we claim as new, and desire to secure by Letters Patent is:

1. A liquid oligomeric composition comprising:
   a cycloaliphatic epoxide; and
   an organic soluble, ungelled, uncrosslinked, Michael addition polyacrylate reaction product having residual pendant unsaturated acrylate groups formed from a multifunctional acrylate Michael acceptor and a β-dicarbonyl Michael donor.

2. The liquid oligomeric composition, according to claim 1, wherein said β-dicarbonyl Michael donor is selected from the group consisting of β-keto esters, β-diketones, β-ketoamides, β-ketoanilides, and mixtures thereof.

3. The liquid oligomeric composition, according to claim 1, wherein said multifunctional acrylate Michael acceptor is selected from the group consisting of diacrylates, triacrylates, and tetraacrylates.

4. The liquid oligomeric composition, according to claim 1, wherein said β-dicarbonyl Michael donor is a β-diketone or a β-ketoester.

5. The liquid oligomeric composition, according to claim 2, wherein said β-dicarbonyl has equivalent functionality (N) wherein N=2, 4, 6, or 8.

6. The liquid oligomeric composition, according to claim 3, wherein the molar acrylic functional group ratio of said diacrylate Michael acceptor to said β-dicarbonyl donor is:
   $\geq 1:1$ where said β-dicarbonyl functionality=2,
   $\geq 4.5:1$ where said β-dicarbonyl functionality=4,
   $\geq 4.5:1$ where said β-dicarbonyl functionality=6, and
   $\geq 3.5:1$ where said β-dicarbonyl functionality=8.

7. The liquid oligomeric composition, according to claim 3, wherein the molar acrylic functional group ratio of said triacrylate Michael acceptor to said β-dicarbonyl donor is:
   $\geq 2.25$ where said β-dicarbonyl functionality=2,
   $\geq 6.4:1$ where said β-dicarbonyl functionality=4,
   $\geq 7.8:1$ where said β-dicarbonyl functionality=6, and
   $\geq 7.4:1$ where said β-dicarbonyl functionality=8.

8. The liquid oligomeric composition, according to claim 3, wherein the molar acrylic functional group ratio of said tetraacrylate Michael acceptor to said β-dicarbonyl donor is:
   $\geq 6.6$ where said acetoacetate functionality=2,
   $\geq 12.3:1$ where said β-dicarbonyl functionality=4,
   $\geq 13.2:1$ where said β-dicarbonyl functionality=6, and
   $\geq 12.7:1$ where said β-dicarbonyl functionality=8.

9. The liquid oligomeric composition, according to claim 1, wherein said cycloaliphatic epoxide has a Brookfield viscosity of <1,000 cp at 25° C.

10. The liquid oligomeric composition, according to claim 9, wherein said cycloaliphatic epoxide is selected from the group consisting of 3,4-epoxycyclohexylmethyl-3,4epoxycyclohexane carboxylate and bis-(3,4-epoxycyclohexyl) adipate.

11. The liquid oligomeric composition, according to claim 10, wherein a preferred cycloaliphatic epoxide is 3,4-epoxycyclohexylmethyl-3,4-epoxycyclohexane carboxylate.

12. The liquid oligomeric composition, according to claim 1, wherein said Michael addition reaction is carried out in the presence of a strong base.

13. The liquid oligomeric composition, according to claim 12, wherein said base is chosen from the group consisting of cyclic amidines, guanidines, group I alkoxides, quaternary hydroxides, quaternary alkoxides, and alkoxide bases generated in situ by reaction between a halide anion and an epoxy moiety.

14. The liquid oligomeric composition, according to claim 12, wherein said base is selected from the group consisting of diazabicycloundecene (DBU), diazabicyclo-nonene (DBN), and 1,1,3,3-tetramethyl guanidine.

15. The liquid oligomeric composition, according to claim 12, wherein said base is an alkoxide generated in-situ by reaction between a quaternary halide and an epoxide moiety.

16. The liquid oligomeric composition, according to claim 3, wherein said diacrylate is selected from the group consisting of:
   ethylene glycol diacrylate, propylene glycol diacrylate,
   diethylene glycol diacrylate, dipropylene glycol diacrylate,
   triethylene glycol diacrylate, tripropylene glycol diacrylate,
   tertraethylene glycol diacrylate, tetrapropylene glycol diacrylate,
   polyethylene glycol diacrylate, polypropylene glycol diacrylate,
   ethoxylated bisphenol A diacrylate,
   bisphenol A diglycidyl ether diacrylate,
   resorcinol diglycidyl ether diacrylate,
   1,3-propanediol diacrylate,
   1,4-butanediol diacrylate,
   1,5-pentanediol diacrylate,
   1,6-hexanediol diacrylate,
   neopentyl glycol diacrylate,
   cyclohexane dimethanol diacrylate,
   ethoxylated neopentyl glycol diacrylate, propoxylated neopentyl glycol diacrylate, ethoxylated cyclohexanedimethanol diacrylate, propoxylated cyclohexanedimethanol diacrylate,
   acrylated epoxy diacrylates,
   aryl urethane diacrylates, aliphatic urethane diacrylates, polyester diacrylates, and mixtures thereof.

17. The liquid oligomeric composition, according to claim 3, wherein said triacrylate is selected from the group consisting of:
   trimethylol propane triacrylate,
   glycerol triacrylate,
   ethoxylated trimethylolpropane triacrylate, propoxylated trimethylolpropane triacrylate, tris (2-hydroxyethyl) isocyanurate triacrylate,
   ethoxylated glycerol triacrylate, propoxylated glycerol triacrylate,
   pentaerythritol triacrylate,
   aryl urethane triacrylates, aliphatic urethane triacrylates,
   melaimine triacrylates,
   aliphatic epoxy triacrylates,
   epoxy novolac triacrylates,
   polyester triacrylates and mixtures thereof.

18. The liquid oligomeric composition, according to claim 3, wherein said tetraacrylate is selected from the group consisting of
   di-trimethylolpropane tetraacrylate pentaerythritol tetraacrylate,
   ethoxylated pentaerythritol tetraacrylate, propoxylated pentaerythritol tetraacrylate, dipentaerythritol tetraacrylate,
   ethoxylated dipentaerythritol tetraacrylate, propoxylated dipentaerychritol tetraacrylate,
   aryl urethane tetraacrylates, aliphatic urethane tetraacrylates, polyester tetraacrylates,
   melamine tetraacrylates,
   epoxy novolac tetraacrylates, and mixtures thereof.

19. The liquid oligomeric composition, according to claim 5, wherein said β-dicarbonyl donor compound having functionality=2 is selected from the group consisting of:
   ethyl acetoacetate,
   methyl acetoacetate,
   2-ethylhexyl acetoacetate,
   lauryl acetoacetate,
   t-butyl acetoacetate,
   acetoacetanilide,
   N-alkyl acetoacetanilide acetoacetamide,
   2-acetoacetoxyethyl methacrylate, allyl acetoacetate,
   benzyl acetoacetate,
   2,4-pentanedione,
   isobutyl acetoacetate, and
   2-methoxyethyl acetoacetate.

20. The liquid oligomeric composition, according to claim 5, wherein said β-dicarbonyl donor compound having functionality=4 is selected from the group consisting of:
   1,4-butanediol diacetoacetate,
   1,6-hexanediol discetoacetate,
   neopentyl glycol diacetoacetate,
   cyclohexane dimethanol diacetoacetate, and
   alkoxylated bisphenol A diacetoacetate.

21. The liquid oligomeric composition, according to claim 5, wherein said β-dicarbonyl donor compound having functionality=6 is selected from the group consisting of:
   trimethylol propane triacetoacetate,
   glycerin triacetoacetate, and
   polycaprolactone triacetoacetates and alkoxylated derivates thereof.

22. The liquid oligomeric composition, according to claim 5, wherein said β-dicarbonyl donor compound having functionality=8 is pentaerythritol tetraacetoacetate and alkoxylated derivates thereof.

23. The liquid oligomeric composition, according to claim 1, wherein said Michael addition reaction occurs in the presence of at least one non-reactive solvent.

24. The liquid oligomeric composition, according to claim 21, wherein said non-reactive solvent is selected from the group consisting of styrene, t-butyl styrene, α-methyl styrene, vinyl toluene, vinyl acetate, allyl acetate, allyl methacrylate, diallyl phthalate, $C_1$–$C_{18}$-methacrylate esters, dimethacrylates, and trimethacrylates.

25. The liquid oligomeric composition, according to claim 1, wherein said composition is shelf stable for more than one month and has residual pendant unsaturated acrylate groups.

26. The liquid oligomeric composition, according to claim 1, wherein said composition further comprises at least one additive.

27. The liquid oligomeric composition, according to claim 26, wherein said additive is selected from the group consisting of pigments, gloss modifiers, flow and leveling agents and other additive as appropriate to formulate coatings, paints, laminates, sealants, adhesives and inks.

28. The liquid oligomeric composition, according to claim 1, further comprising a cationic photoinitiator.

* * * * *